United States Patent
Gauthier, Jr. et al.

(10) Patent No.: US 7,825,003 B2
(45) Date of Patent: Nov. 2, 2010

(54) METHOD OF DOPING FIELD-EFFECT-TRANSISTORS (FETS) WITH REDUCED STRESS/STRAIN RELAXATION AND RESULTING FET DEVICES

(75) Inventors: Robert J. Gauthier, Jr., Hinesburg, VT (US); Rajendran Krishnasamy, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 689 days.

(21) Appl. No.: 11/768,266

(22) Filed: Jun. 26, 2007

(65) Prior Publication Data

US 2009/0001413 A1    Jan. 1, 2009

(51) Int. Cl.
*H01L 21/76* (2006.01)

(52) U.S. Cl. .................. 438/423; 438/149; 438/154; 438/197; 257/E21.561

(58) Field of Classification Search .............. 438/423, 438/149, 154, 197; 257/E21.561
See application file for complete search history.

(56) References Cited

U.S. PATENT DOCUMENTS

| | | | |
|---|---|---|---|
| 6,509,241 | B2 | 1/2003 | Park et al. |
| 6,949,796 | B1 | 9/2005 | Ellis-Monaghan et al. |
| 6,979,622 | B1 | 12/2005 | Thean et al. |
| 6,989,322 | B2 | 1/2006 | Gluschenkov et al. |
| 7,415,538 | B2 | 5/2006 | Ieong et al. |
| 2003/0136985 | A1 | 7/2003 | Murthy et al. |
| 2004/0007724 | A1 | 1/2004 | Murthy et al. |
| 2004/0110351 | A1 | 6/2004 | Narasimha |
| 2008/0001260 | A1* | 1/2008 | Zhu et al. .................. 257/622 |
| 2008/0003787 | A1* | 1/2008 | Yang ......................... 438/510 |
| 2008/0057710 | A1* | 3/2008 | Zhu et al. .................. 438/682 |

* cited by examiner

*Primary Examiner*—Zandra Smith
*Assistant Examiner*—Telly D Green
(74) *Attorney, Agent, or Firm*—Edward W Brown

(57) ABSTRACT

A method for fabricating a FET transistor for an integrated circuit by the steps of forming recesses in a substrate on both sides of a gate on the substrate, halo/extension ion implanting into the recesses, and filling the recesses with embedded strained layers comprising dopants for in-situ doping of the source and drain of the transistor. The stress/strain relaxation of the resulting transistor is reduced.

14 Claims, 12 Drawing Sheets

METHOD OF DOPING FIELD-EFFECT-TRANSISTORS (FETS) WITH REDUCED STRESS/STRAIN RELAXATION AND RESULTING FET DEVICES

FIELD OF THE INVENTION

The present invention relates to the fabrication and structure of semiconductor devices and transistors and, more particularly, to the fabrication and structure of Metal-Oxide-Semiconductor Field-Effect-Transistors(MOSFET) devices, especially complementary FET or CMOS.

BACKGROUND OF THE INVENTION

The trend in semiconductor manufacture continues to be reducing the size of semiconductor devices while, at the same time, increasing their density on the chip. From a performance standpoint, the trend is to increase the speed of the devices and to reduce their power consumption. At the present time, the integrated circuit chips consist of billions of devices on each chip.

To be able to reduce the size and density of the devices on the chip, the dimensions of the devices have to be made small. For example, the dimensions of the gate thickness and the source and drain of the FET now are in the micrometer and nanometer range. With these miniature dimensions, however, performance problems of the devices result, such as short channel effects, punch through, and current leakage.

One solution to these performance problems is to embed strained regions of, for example, eSiGe in pFET (compressive strain/stress for hole mobility enhancements) and, for example, eSiC in nFET (tensile strain/stress for electron mobility enhancements), preferably by a low to high temperature epitaxy process, after first forming recesses in a substrate for the eSiGe and eSiC. These embedded strained regions, which are in the substrate on either side of the channel region, are generally aligned to the gate of the FET and are doped in the same manner as the regular source/drain regions of the FETs. The embedded strained regions function mainly to create a respective stress/strain (compressive strain/stress for pFETS and tensile strain/stress for nFETs) in the channel to increase carrier mobilities.

Preferably, the eSiGe and eSiC are epitaxially deposited in the layer of silicon. However, due to the inclusion of the germanium, the lattice of the alloy has a larger spacing than the spacing of the lattice of the layer of the silicon. The large spacing creates a stress (compression) in the channel of the transistor between the source and the drain layers. Due to the inclusion of the carbon, the lattice of the alloy has a smaller spacing than the spacing of the lattice of the layer of the silicon. The smaller spacing creates a stress (tensile) in the channel of the transistor between the source and drain layers. The stresses (compressive due to eSiGe for pFET or PMOS and tensile due to eSiC for nFET or NMOS) together with reduced resistivity due to the higher active dopant concentration, increases carrier mobility or $I_{dsat}$ and $I_{dlin}$ of the transistor, such as CMOS.

In order for a FET transistor, such as a CMOS, to work properly, various dopants, including halo, extension, and source/drain, need to be implanted at the right places and with specific concentrations. The implantation of all of these various dopants into the embedded strained layers (i.e., —eSiGe and eSiC) generate a great amount of damage into the strained layers. Damage relaxes the strained silicon (which is believed to be due to displacing the substitution strained dopants to the interstitial site which, in turn, reduces the strain/stress in the embedded strained eSiGe and eSiC layers in the source/drain regions and also further believed that strained silicon may experience relaxation via misfit/threading dislocation propagation). This relaxation caused by implanted doping damage from the halo, extension and source/drain implantations into the embedded strained layers reduces the strain/stress in the embedded strained layers, which, in turn, reduces the strain/stress in the channel which, in turn, reduces the carrier mobility and degrades the device performance. Various stress measurement data shows that approximately more than 50% of stress relaxes just after the halo implantation itself into the embedded strained eSiGe and eSiC layers in the source/drain regions. Further additional strain relaxation occurs (additional 10 to 20%) by performing the extension implantation into the embedded strained source/drain regions. Another additional 10 to 20% strain/stress relaxation occurs after the source/drain implantation into the embedded strained source/drain regions.

This strain relaxation causes a reduction of stress/strain in the source/drain embedded strain layers. This creates a performance problem because the embedded strain layers in the source/drain region stress the channel and then create the respective strain/stress in the channel for carrier mobility. However, the reduced source/drain stress causes reduction of channel stress and the reduced strain/stress in the channel, in turn, degrades the device performance because strain/stress in the channel is directly proportional to carrier mobility.

SUMMARY OF THE INVENTION

Accordingly, the primary object of the present invention is to fabricate FET, such as CMOS, devices with embedded strained layers, such as eSiGe (for pFET) and eSiC (for nFET), and with halo/extension implants without generating any damage in the embedded strained regions and to achieve reduced stress/strain relaxation in the embedded strained source/drain regions as well as the channel region.

A further object of the present invention is to provide the dopants for the source and drain without resorting to ion implantation.

An additional object of the present invention is to provide a fabrication process which permits the implant of halo/extension dopants at adjusted dose/energy without affecting the junction depths of the FET or CMOS devices.

Another object of the present invention is to achieve a reduction in the stress/strain relaxation without unduly complicating the fabrication process.

These and other objects and features of the present invention are accomplished by performing halo/extension implantation into recessed silicon before forming the embedded strained region, thereby reducing the stress/strain relaxation in the embedded strained layers. The reduced relaxation is further accomplished by (in-situ) doping the source/drain region while, at the same time, forming the embedded strained layer by preferably separately epitaxially growing the layer. This provides for a higher activation of source/drain doping concentrations and reduces sheet resistance. An advantage of the present invention is that the fabrication process permits the use of adjusted dose/energy for the halo/extension dopants without changing the junction depth of the devices, herein CMOS devices.

BRIEF DESCRIPTION OF THE DRAWINGS

These and further features of the present invention will be apparent with reference to the following description and drawings of FIGS. 1-15 of the prior art method followed by FIGS. 16-30 of the method of the present invention, and with additional comparison graphs of FIGS. 31-33, wherein.

Figure 1:
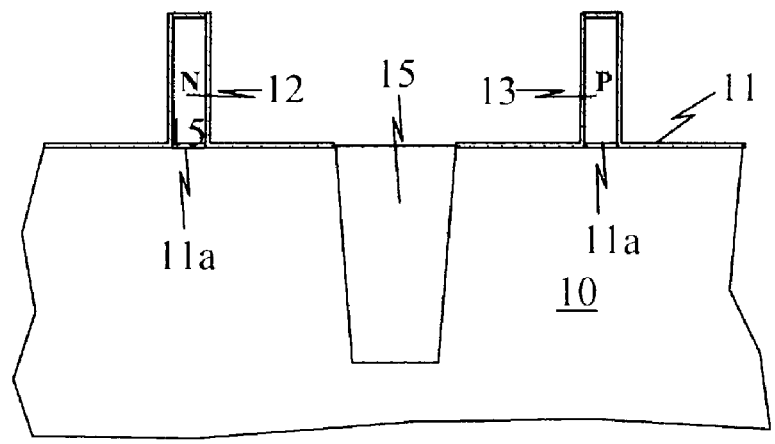
FIG. 1 (PRIOR ART) is a cross-sectional view of a semiconductor substrate which is formed with an isolation trench between n-type and p-type pair of gates and having an oxide layer on its surface.

In the following detailed description, it will be understood that for simplicity and clarity of illustration, elements shown in the figures have not been drawn to scale. In addition, where considered appropriate, reference numbers have been repeated among the figures to indicate corresponding elements. Further, it will be understood that the foregoing description and the following description of the present invention are exemplary and are not restrictive of the invention

DETAILED DESCRIPTION OF THE INVENTION

In accordance with the present invention, an improved fabrication process and semiconductor transistor device structure for FETs, such as pFETs (PMOS), nFETs (NMOS) and CMOS will be described. The process to be described enhances the transistor performance by reducing the stress/strain relaxation due to the damage accumulations from halo, extension, source/drain implantations into an embedded strained SiGe (eSiGe) for PMOS and an embedded strained SiC (eSiC) for NMOS layers or films in the source/drain region. Source and drain films or layers are made of an alloy of silicon and germanium and an alloy of silicon and carbon and, again in accordance with the present invention, by incorporating in-situ doping of boron or indium or the combination of both, during deposition, a higher active dopant concentration can be obtained than with implanted techniques, as well as reduced damage.

The eSiGe and eSiC alloys are epitaxially deposited on the layer of silicon. However, due to the inclusion of the germanium, the lattice of the alloy has a larger spacing than the spacing of the lattice of the layer of silicon. The large spacing creates a stress (compressive) in a channel of the transistor between the source and drain films. Due to the inclusion of the carbon, the lattice of the alloy has a smaller spacing than the spacing of the lattice of the layer of silicon. The smaller spacing creates a stress (tensile) in a channel of the transistor between the source and drain films or layers. The stresses (compressive due to eSiGe for PMOS and tensile due to eSiC for NMOS) together with reduced resistivity due to the higher active dopant concentration, increases carrier mobility or $I_{dsat}$ and $I_{dlin}$ of the transistor, such as CMOS.

FIGS. 1 through 15 illustrate an existing or prior art method for fabricating integrated circuits of the density described in the BACKGROUND section of the specification. However, this existing method creates a great deal of damage in the embedded strained layers which immediately relaxes the stress/strain in the embedded strained layers and results in reduced channel stress. The method of the present invention and the resulting integrated circuit structure are described in FIGS. 16 through 30 and this description will distinguish it from the existing method and explain how it minimizes or reduces the strain/strain relaxation due to the damages from the prior art method from halo/extension and from source/drain implantations into the embedded strained regions.

Figure 2:
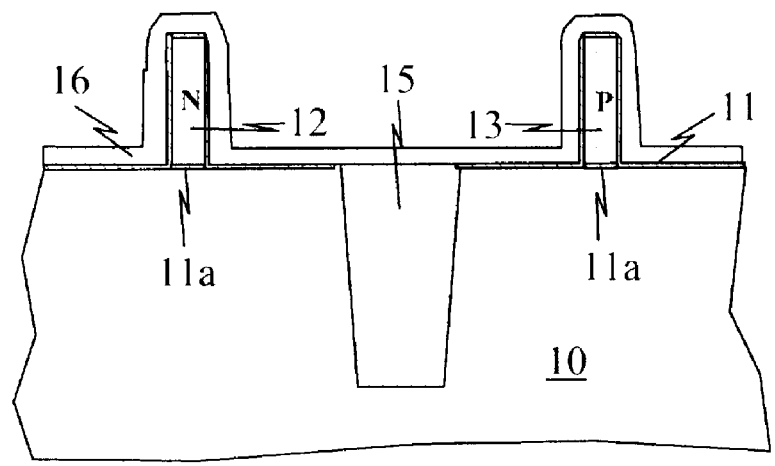
FIG. 2 (PRIOR ART) is a cross-sectional view of the substrate of FIG. 1 with an insulating layer on the oxide layer.
Figure 3:
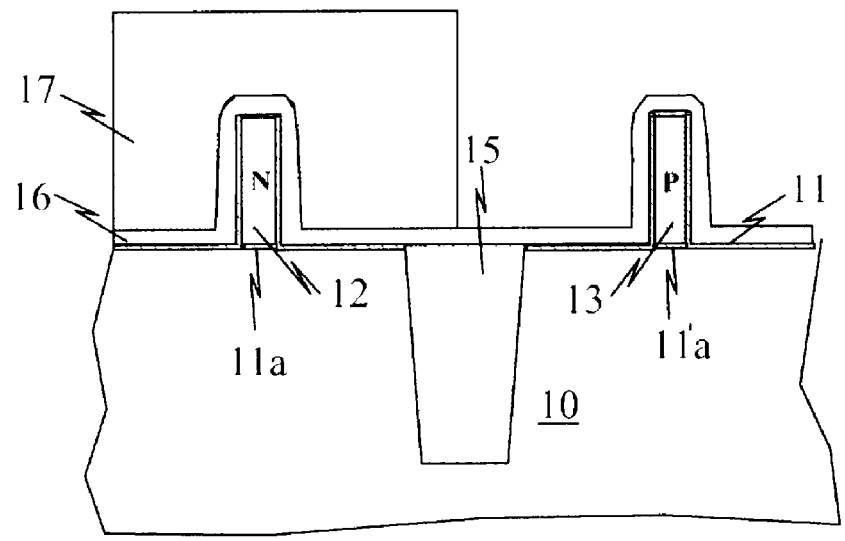
FIG. 3 (PRIOR ART) is a cross-sectional view of the substrate of FIG. 2 with a resist mask covering the n-type gate.
Figure 4:
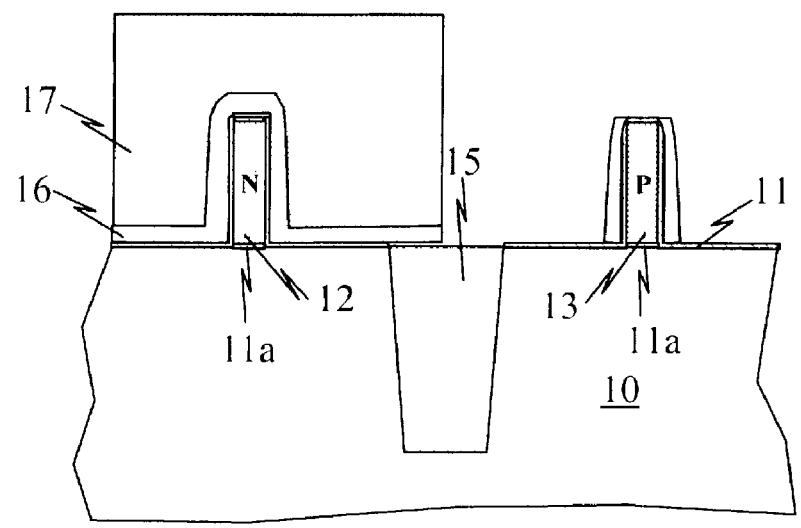
FIG. 4 (PRIOR ART) is a cross-sectional view of the substrate of FIG. 3 with the insulating layer removed on the oxide surface, partially on the sides and on the top of the p-type gate.
Figure 5:
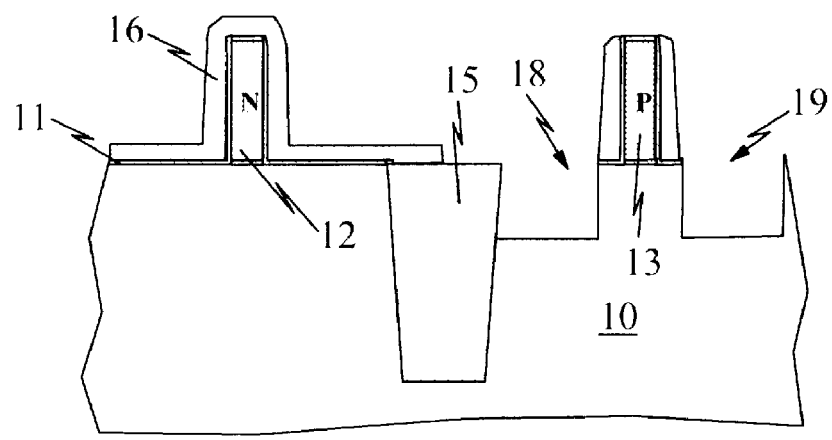
FIG. 5 (PRIOR ART) is a cross-sectional view of the substrate of FIG. 4 with an insulating layer covering and on both sides of the n-type gate and formed with recesses on both sides of the p-type gate.
Figure 6:
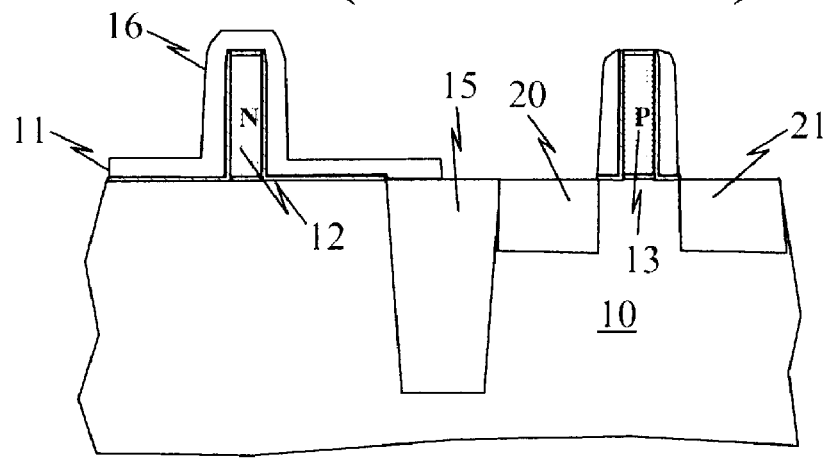
FIG. 6 (PRIOR ART) is a cross-sectional view of the substrate of FIG. 5 with embedded material formed in the recesses as embedded strained layers on both sides of the p-type gate.
Figure 7:
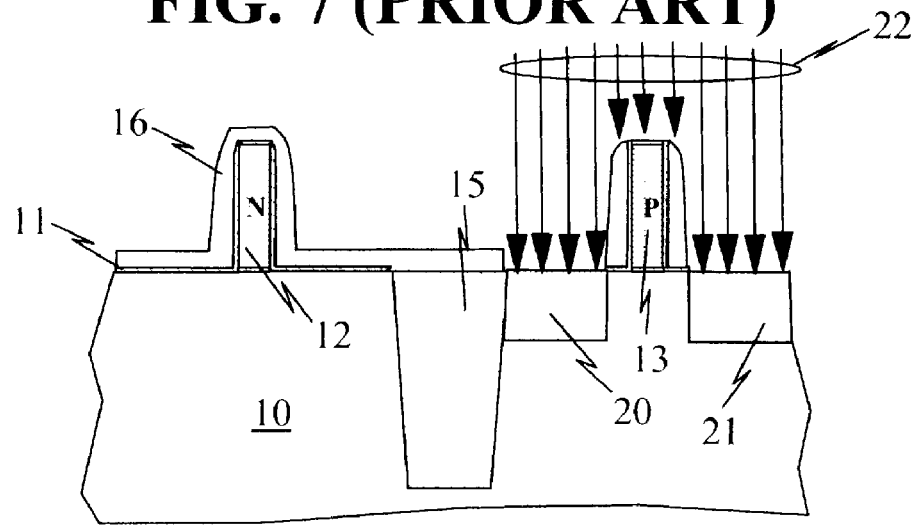
FIG. 7 (PRIOR ART) is cross-sectional view of the substrate of FIG. 6 with halo/extension ions implanted into the embedded strained layers.
Figure 8:
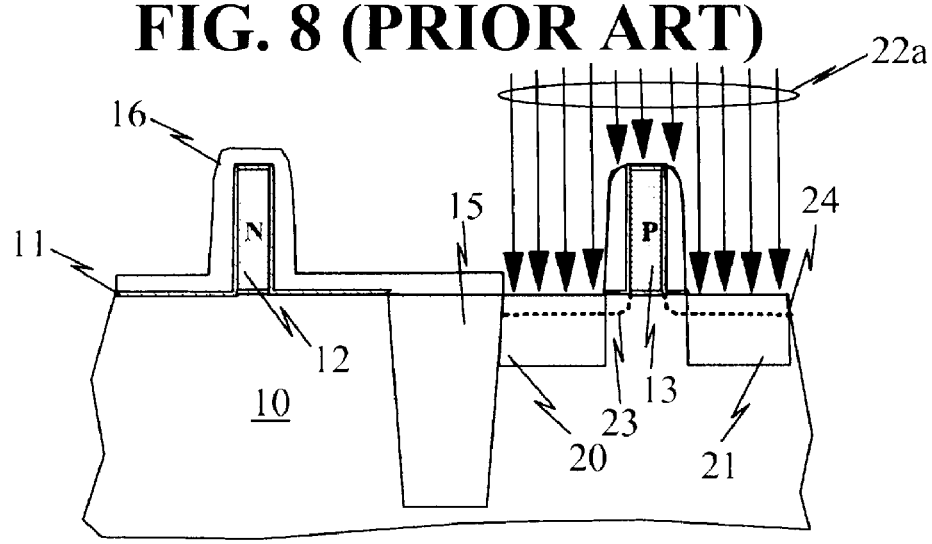
FIG. 8 (PRIOR ART) is a cross-sectional view of the substrate of FIG. 7 with source and drain dopants implanted on opposite sides of the n-type gate and into the embedded strained layers.

FIG. 1 shows a semiconductor substrate 10 having a thin insulating layer 11, such as silicon oxide, formed therein and with n-type 12 and p-type 13 gates, herein polysilicon, formed thereon for the fabrication of a CMOS. The portion of the silicon oxide layer 11 over the channel (not shown) and under the gates serves as the gate oxide 11a. The walls of the gates also are coated with the insulating layer 11. (Although the description of the existing method and the method of the present invention will focus on a CMOS device, both methods are suitable for the separate fabrication of a NMOS and a PMOS.) The CMOS gates in both methods are electrically isolated by a shallow recessed insulation trench 15 which is well known in the art. In FIG. 2, an insulating conformal disposable layer 16 is formed on the gates 12 and 13 and on the thin insulating layer 11. Herein, the insulating layer 16 is silicon nitride which preferably is deposited by low pressure deposition. The surface of the insulating layer is oxidized (not shown). Next, as shown in FIG. 3, the n-type gate 12 is coated with a resist material 17, as is well known in the art, to mask the gate 12 during further processing of the p-type gate 13. In FIG. 4, the disposable layer 16 is removed by directional etching, preferably reactive ion etching with a commercially available etchant gas for etching silicon nitride. To form the embedded strained layers on either side of the gate 12, recesses 18 and 19 are etched in the silicon substrate 10, as shown in FIG. 5, on either side of the p-type gate and through the oxide layer on the surface. Embedded strained layers 20 and 21 are selectively epitaxially grown in the silicon recesses 18 and 19, as shown in FIG. 6. For a p-type gate, epitaxially grown embedded strained eSiGe is the preferred material to create compressive stress/strain in the channel. After forming the embedded strained regions 20 and 21, a halo/extension ion implant 22, which is mostly either arsenic (As) or phosphorus (P) for the halo and which is mostly boron (B) for the extension, is directed into the embedded strained eSiGe layers, as shown in FIG. 7. This is followed by implanting dopants 22a for the source 23 and drain 24, which is mostly boron (B), on opposite sides of the p-type gate 13 and again into the embedded strained eSiGe layers, as shown in FIG. 8. For the dopants to be activated, the substrate is thermally annealed.

Figure 9:
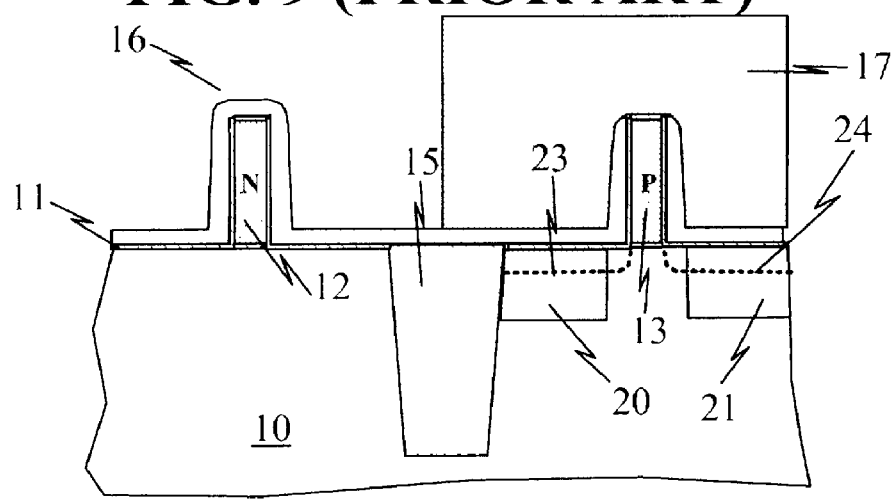
FIG. 9 (PRIOR ART) is a cross-sectional view of the substrate of FIG. 2 with a resist mask covering the p-type gate.
Figure 10:
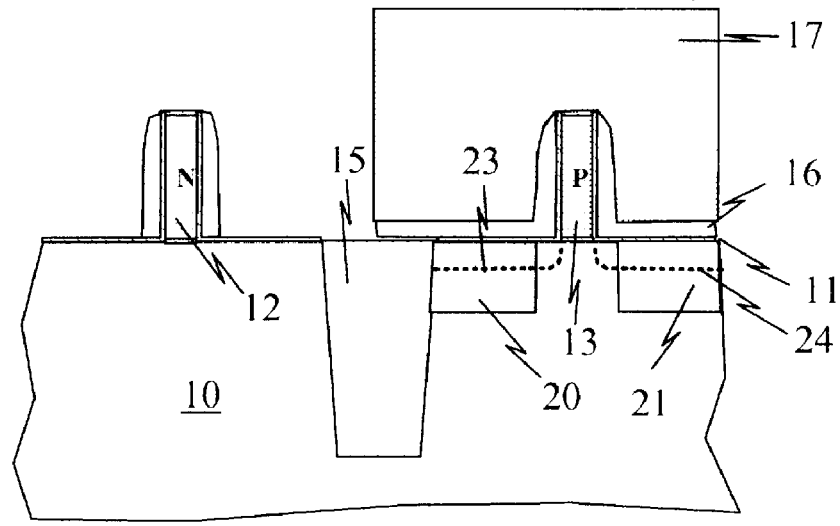
FIG. 10 (PRIOR ART) is a cross-sectional view of the substrate of FIG. 9 with the insulating layer removed on the oxide surface, partially on the sides and the top of the n-type gate.
Figure 11:
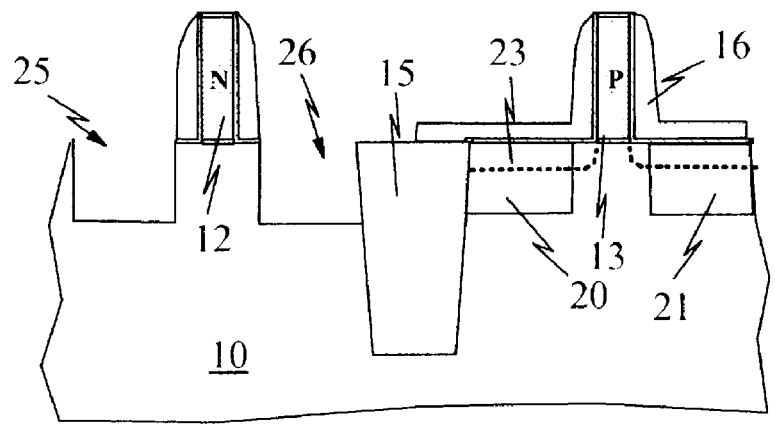
FIG. 11 (PRIOR ART) is a cross-sectional view of the substrate of FIG. 10 with an insulating layer covering and on both sides of the p-type gate and formed with recesses on both sides of the n-type gate.
Figure 12:
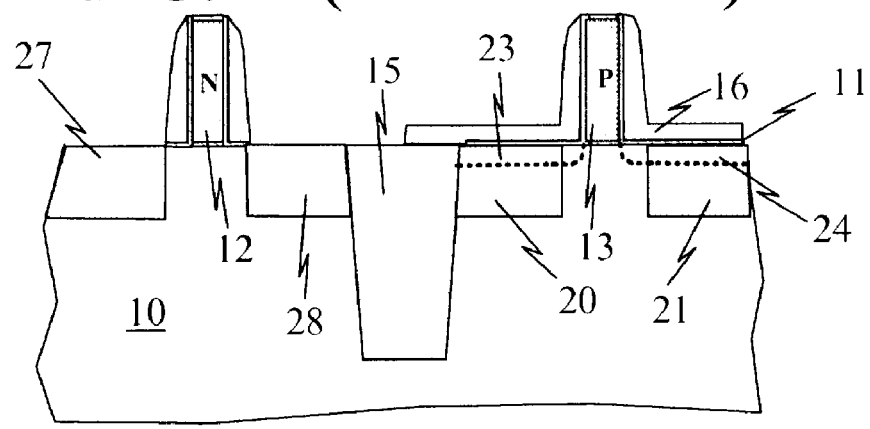
FIG. 12 (PRIOR ART) is a cross-sectional view of the substrate of FIG. 11 with embedded strained layers formed on both sides of the n-type gate.
Figure 13:
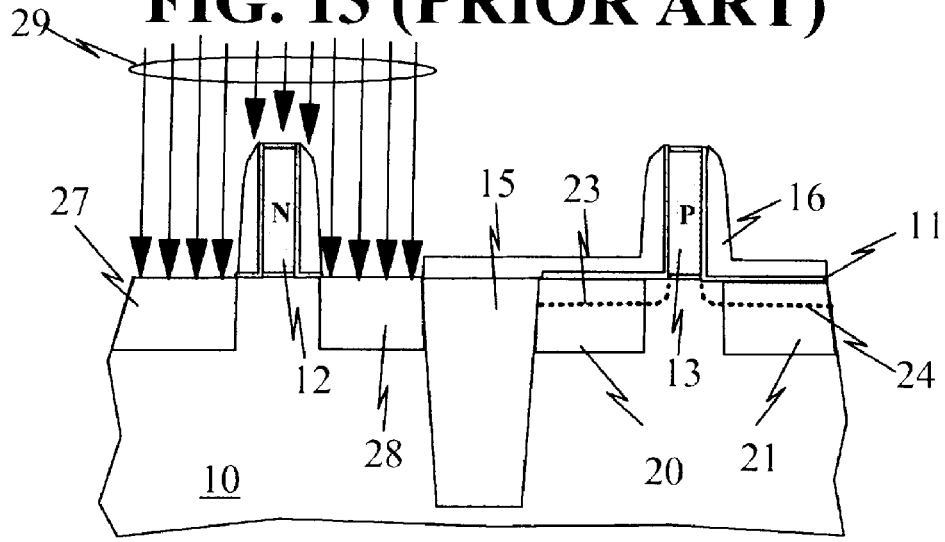
FIG. 13 (PRIOR ART) is a cross-sectional view of the substrate of FIG. 12 with a halo/extension ions implanted into the embedded strained layers.
Figure 14:
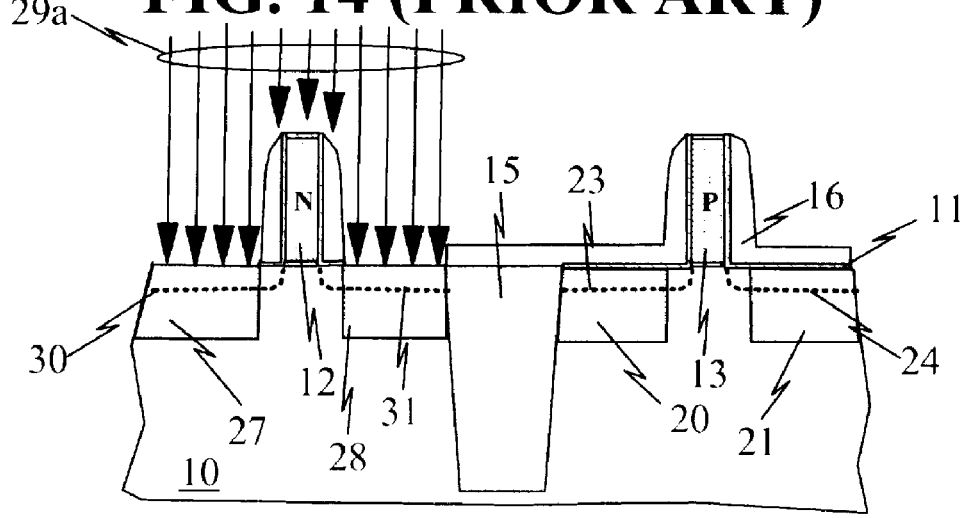
FIG. 14 (PRIOR ART) is a cross-sectional view of the substrate of FIG. 13 with source and drain dopants implanted on opposite sides of the n-type gate and into the embedded strained layers.
Figure 15:
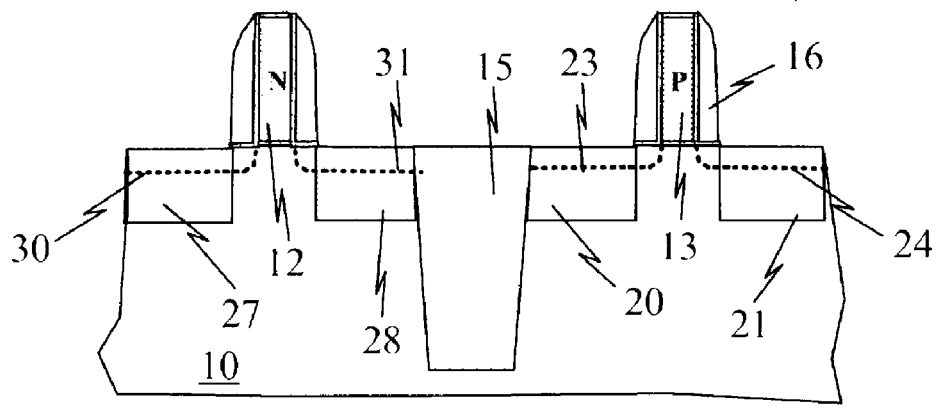
FIG. 15 (PRIOR ART) is a cross-sectional view of the combined substrates of FIGS. 8 and 14.

With the p-FET of the CMOS fabricated, the n-FET portion of the CMOS is processed, with the first two steps being the same as shown in FIGS. 1 and 2, in which the n-type gate 12 on the substrate 10 is formed with a thin insulating layer, such as by oxidization, and coated with a disposable insulating layer 16 of, herein, silicon nitride. The portion of the silicon oxide layer 11 over the channel (not shown) serves as the gate oxide 11a. Now, as shown in FIG. 9, a resist material 17 is deposited on the p-FET to mask the p-type gate and surrounding area for further processing of the n-type gate. The disposable layer 16 and the thin layer 11 on the surface of the substrate 10 are removed by reactive ion etching. The silicon nitride layer 16 on the vertical walls of the n-gate are reduced but not totally removed and serve as spacers for subsequent implants, as shown in FIG. 10. Similar to the p-FET portion, recesses 25 and 26, as shown in FIG. 11, are formed in the substrate, again by reactive ion etching and epitaxially grown embedded strained eSiC layers 27 and 28 are formed, as shown in FIG. 12. After forming the embedded strained eSiC layers, a halo/extension ion implantation 29, which is mostly either arsenic (As) or phosphorus (P) for the halo and which is mostly boron (B) for the extension, is directed into the embedded strained eSiC layers, as shown in FIG. 13. This is followed by implanting dopants 29a for the source 30 and drain 31, which is mostly either arsenic (As) or phosphorus (P), on opposite sides of the n-type gate 13 into the embedded strained eSiC layers, as shown in FIG. 14. A thermal anneal is used to activate the dopants thereby completing the n-FET.

In the existing high performance FET technologies, such as NMOS, PMOS and CMOS, carrier mobility is directly proportional to the stress/strain in the channel of the FET, such as CMOS. The performance of the FET, such as CMOS, will improve as the stress/strain is increased in the channel. Conversely, a decrease in the stress/strain in the channel by performing a halo/extension and source/drain implant into the embedded strained layers will lower the performance of the FET, such as a CMOS. For example, the halo implant generates damage to the embedded strained eSiGe of the p-FET or PMOS, causing stress/strain relaxation believed to be by "kicking out" Ge atoms from the Si substitution sites, and generates damage to the eSiC layers of the n-FET or NMOS causing stress/strain relaxation by "kicking out" the C atoms from the Si substitution sites. The effect (damage accumulation from the various implantations into the embedded strained layers) is to reduce stress/strain in the embedded strained layers and, in turn, stress/strain reduction in the channel of the FETs, such as a CMOS.

Figure 16:
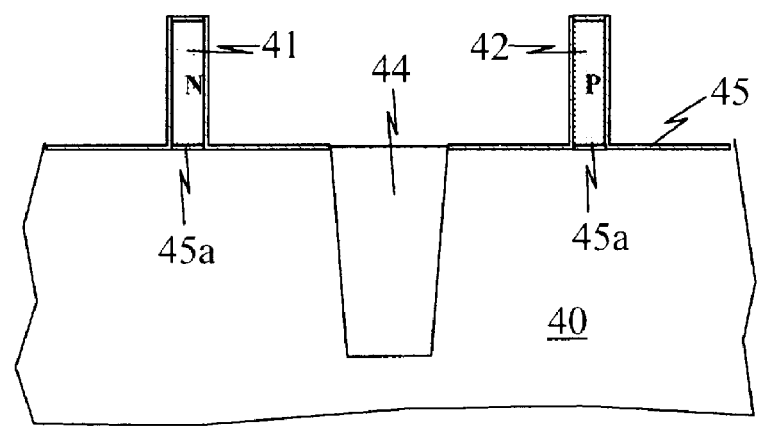
FIG. 16 is a cross-sectional view of the present invention starting with a semiconductor substrate in which is formed an isolation trench between a pair of n-type and p-type gates having an oxide layer on its surface.
Figure 17:
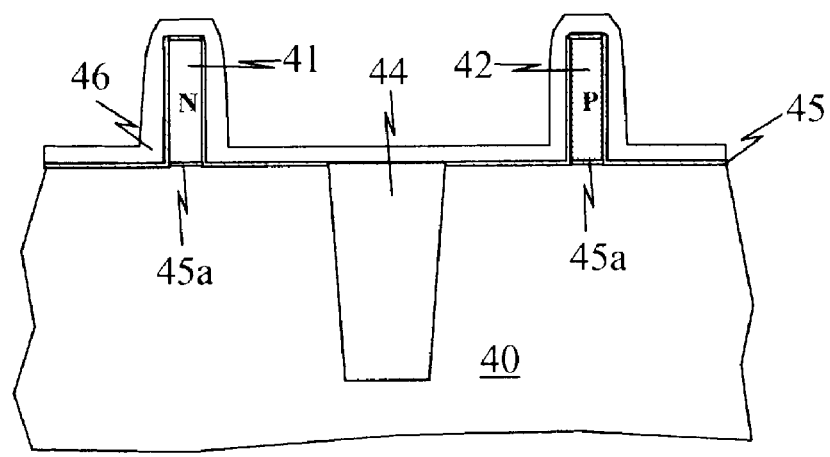
FIG. 17 is a cross-sectional view of the invention with the substrate of FIG. 16 having an insulating layer on the oxide layer.
Figure 18:
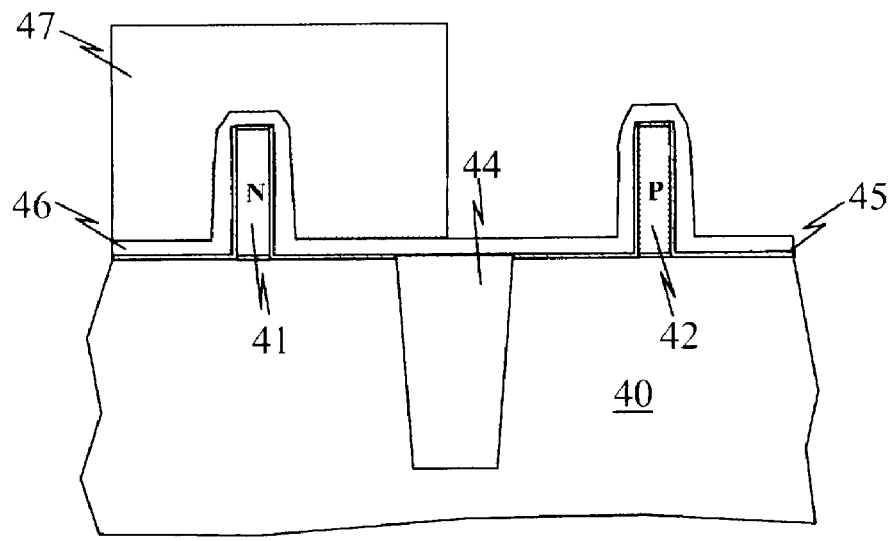
FIG. 18 is a cross-sectional view of the invention with the substrate of FIG. 17 having a resist mask covering the n-type gate.
Figure 19:
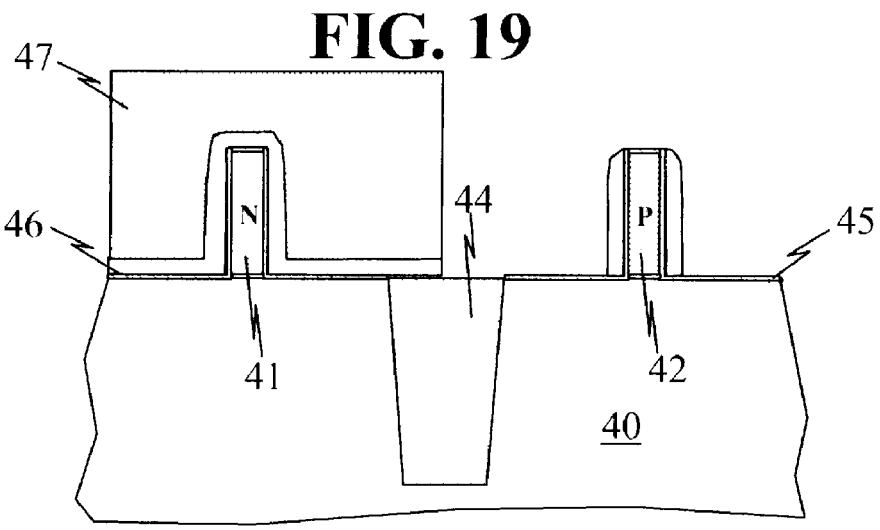
FIG. 19 is a cross-sectional view of the invention with the substrate of FIG. 18 having the insulating layer removed on the oxide surface, partially on the sides and the top of the p-type gate.
Figure 20:
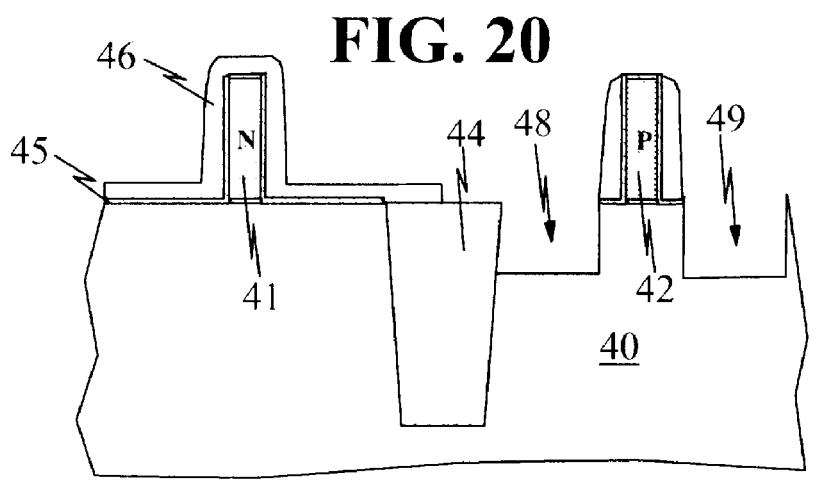
FIG. 20 is a cross-sectional view of the invention with the substrate of FIG. 19 having an insulating layer covering and on both sides of the n-type gate and formed with herein silicon recesses on both sides of the p-type gate.

In accordance with the present invention, the above-described method is modified to minimize or reduce the implantation damage to the embedded strained layers (to avoid stress/strain relaxation) and to maintain a high level of stress/strain in the embedded strained layers and, in turn, higher stress in the channel. The method of the present invention, which is described relative to a CMOS although the invention is broadly applicable to FETs, starts the same as the above-described prior art method, as shown in FIGS. 16 and 17, with a semiconductor substrate 40, preferably silicon, having formed thereon a n-type gate 41 and a p-type gate 42 of preferable polysilicon. The gates 41 and 42 are electrically isolated by a recessed insulation trench 44 as is well know in the art. As shown in FIG. 17, the substrate is formed with a thin insulating layer 45, preferably by oxidizing the substrate surface, and coating it with a disposable, conformal insulating layer 46. The portion of the silicon oxide layer 45 over the channel (not shown) and under the gates serves as the gate oxide 45a. To serve as a spacer, the walls of the gates also are coated with the layer 46. Herein, the disposable insulating layer 46 is silicon nitride which preferably is deposited by low pressure deposition. The surface of the insulating layer is oxidized (not shown). Next, as shown in FIG. 18, the n-type gate 41 is coated with a resist material 47, as is well known in the art, to mask the gate 41 for further processing of the p-type gate 42. In FIG. 19, the disposable layer 46 is removed from the top and partially from the walls of the p-gate and the unmasked area on the substrate surface by directional or anisotropic etching, preferably reactive ion etching with a commercially available etchant gas for etching herein silicon nitride. To subsequently form embedded strained layers on both sides of the gate, recesses 48 and 49 are preferably reactive ion etched into the substrate 40 on both sides of the p-type gate 42 and through the oxide layer 44 on the surface, as shown in FIG. 20. The depth of the silicon recesses 48 and 49 range from 50 nm to 200 nm.

Figure 21:
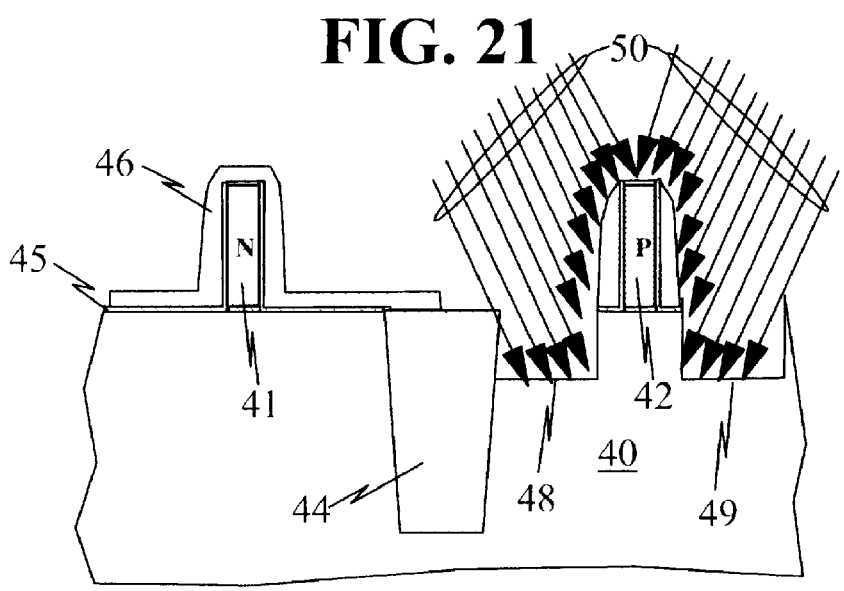
FIG. 21 is a cross-sectional view of the invention with the substrate of FIG. 20 having a halo/extension implanted into the herein silicon recesses on both sides of the p-type gate.
Figure 22:
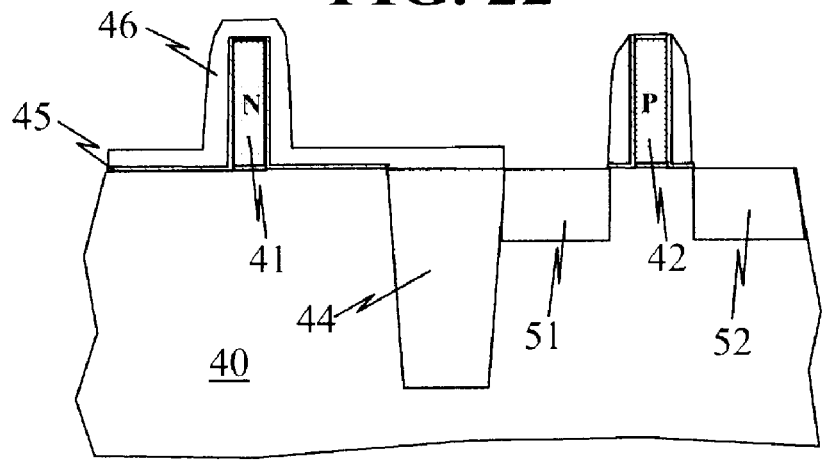
FIG. 22 is a cross-sectional view of the invention with the substrate of FIG. 21 having embedded strained layers (i.e.—eSiGe) being formed herein by growing the layers using a low to high temperature epitaxy process along with in-situ doping (i.e. —boron or indium) to form a source and a drain on opposite sides of the p-type gate.
Figure 23:
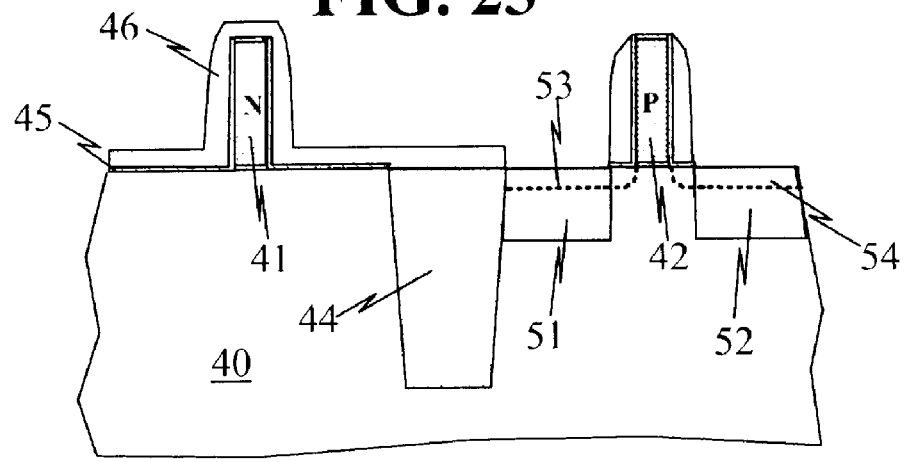
FIG. 23 is a cross-sectional view of the invention with the substrate of FIG. 22 showing the source and drain vertical profiles from the in-situ doping in FIG. 22.

Now, instead of forming embedded strained layers, as practiced in the prior art method described above, a halo/extension of ions 50 of preferably, for the halo of either arsenic (As), phosphorus (P), antimony (Sb) or a combination thereof, and preferably for the extension of either boron (B), indium (In) or a combination thereof are implanted into the herein silicon recesses 48 and 49, in accordance with the present invention, as shown in FIG. 21. After the halo/extension implant 50, into the silicon recess regions, embedded strained layers 51 and 52 are selectively epitaxially grown in the herein silicon recesses 48 and 49, as shown in FIG. 22, with in-situ doping for the source 53 and drain 54 with preferably boron (B), indium (In) or a combination thereof, as shown in FIG. 23. This effectively eliminates or substantially minimizes the damage from the halo/extension and source/drain implantations into the embedded stained layers by the prior art method. By this method of the present invention, the stress/strain relaxation in embedded strained layers is substantially reduced and minimized and, in turn, the relaxation of the stress in the channel is substantially decreased. (This is not the result in the prior art method described in FIGS. 1-15.) For a p-type gate, embedded eSiGe is the preferred strained layers. The Ge in the embedded strained eSiGe is from 10% to 40%. The dopants are activated by a thermal anneal.

Figure 24:
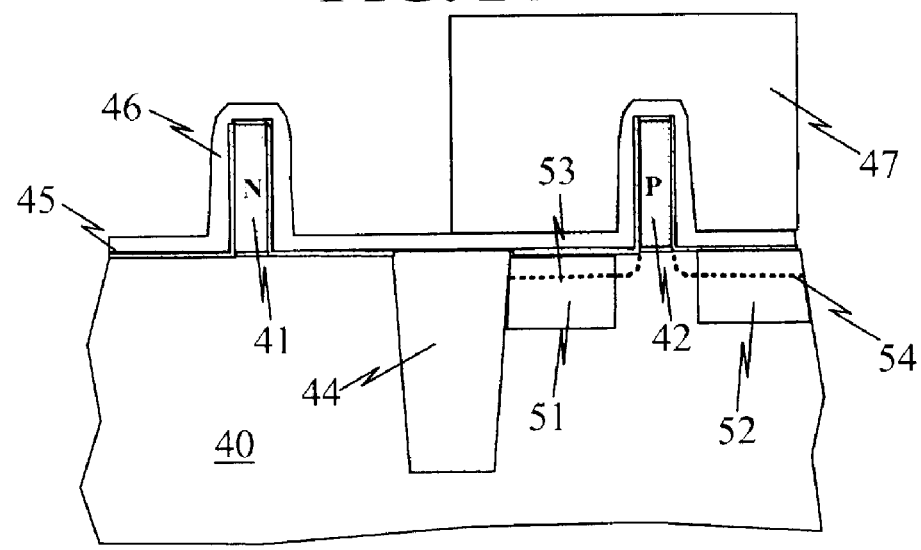
FIG. 24 is a cross-sectional view of the invention of the substrate of FIG. 17 with a resist mask covering the p-type gate.
Figure 25:
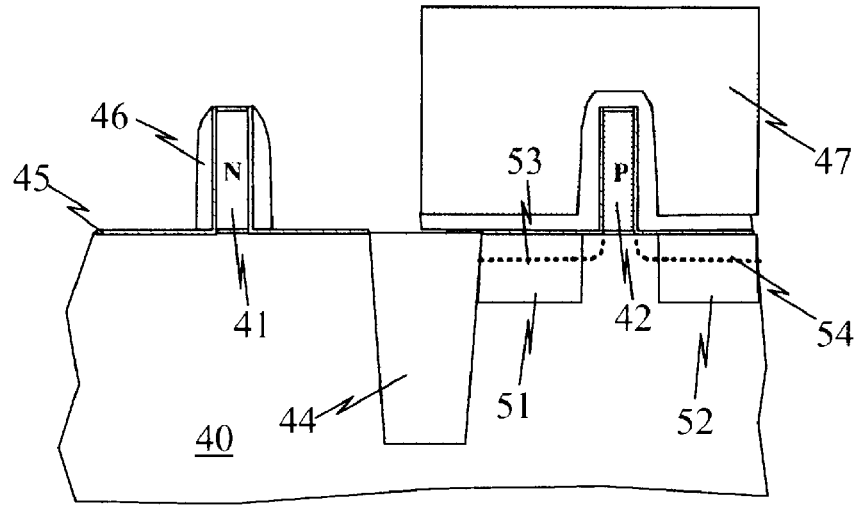
FIG. 25 is a cross-sectional view of the invention with the substrate of FIG. 23 having the insulating layer removed on the oxide surface, partially of the sides and the top of the n-type gate.
Figure 26:
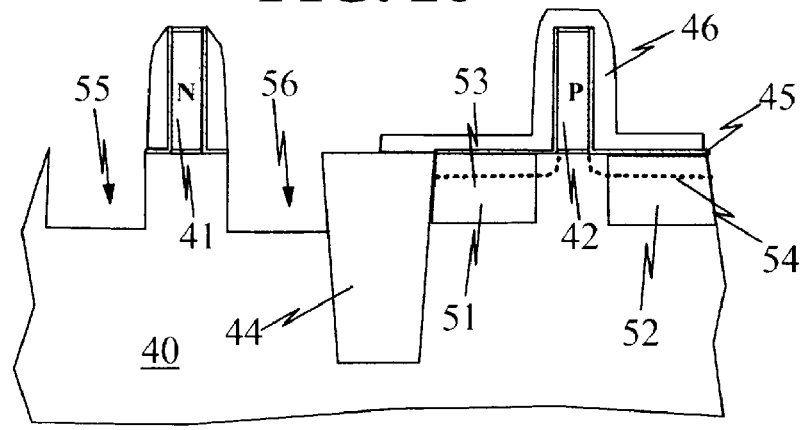
FIG. 26 is a cross-sectional view of the invention with the substrate of FIG. 24 having an insulating layer covering and on both sides of the p-type gate and formed with herein silicon recesses on both sides of the n-type gate.

With the p-FET of the CMOS fabricated in accordance with the present invention, the n-FET portion of the CMOS is formed, with the first two steps being the same as shown in FIG. 16 and 17. A n-type gate 41 is deposed on the substrate 40, herein silicon, with a thin insulating layer 45, such as by oxidization, and having coated thereon a disposable insulating layer 46 of, herein, silicon nitride. The portion of the silicon oxide layer 45 over the channel (not shown) and under the gates serves as the gate oxide 45a. Now, as shown in FIG. 24, a resist material 47 is deposited on the p-FET gate 42 to mask the p-type gate and surrounding area for further processing of the n-type gate. As shown in FIG. 25, the disposable layer 46 and the thin layer 45 on the surface of the substrate 10 are removed by preferably reactive ion etching. The silicon nitride layer 46 on the vertical walls of the n-gate is reduced but not totally removed. Similar to the p-FET portion, recesses 54 and 55, as shown in FIG. 26, are formed in the substrate by anisotropic etching, such as reactive ion etching.

Figure 27:
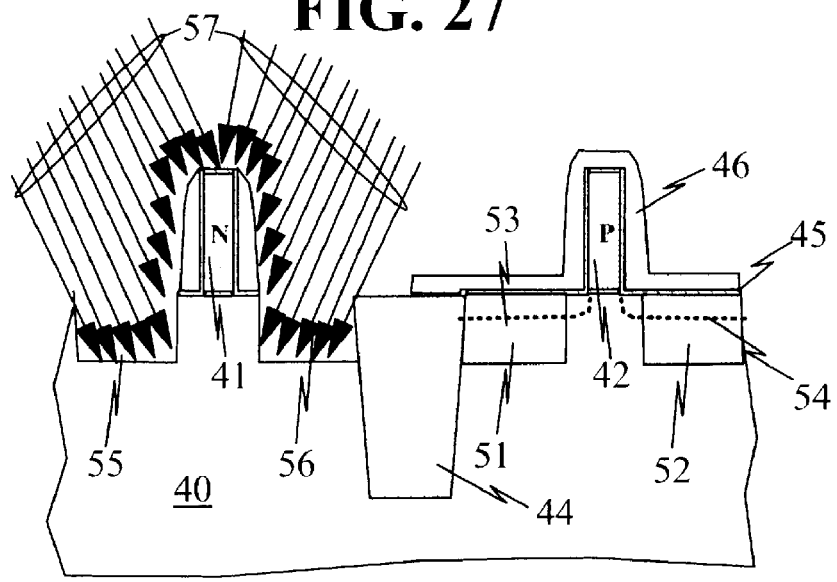
FIG. 27 is a cross-sectional view of the invention with the substrate of FIG. 25 having a halo/extension implanted into the herein silicon recesses on both sides of the n-type gate.
Figure 28:
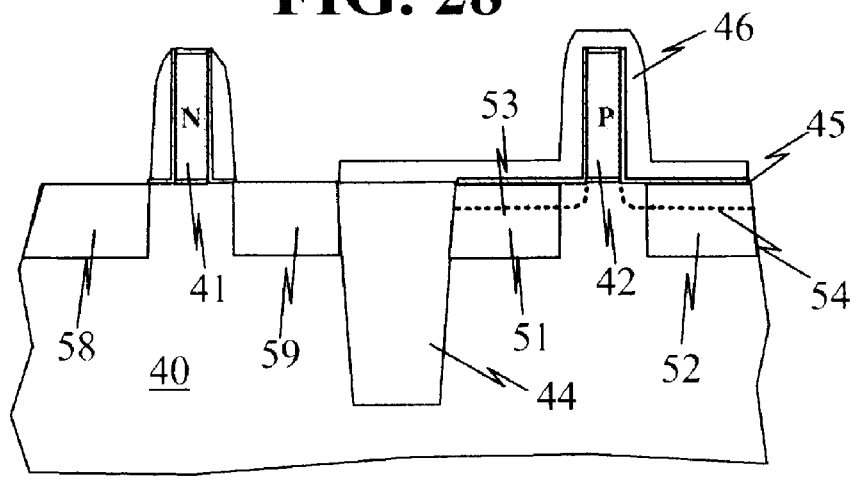
FIG. 28 is a cross-sectional view of the invention with the substrate of FIG. 26 having embedded strained layers (i.e. —eSiC) being formed herein by growing the layers using a low to high temperature epitaxy process along with in-situ doping (i.e. —arsenic, phosphorus, antimony or the combination thereof) to form a source and a drain on opposite sides of the n-type gate.
Figure 29:
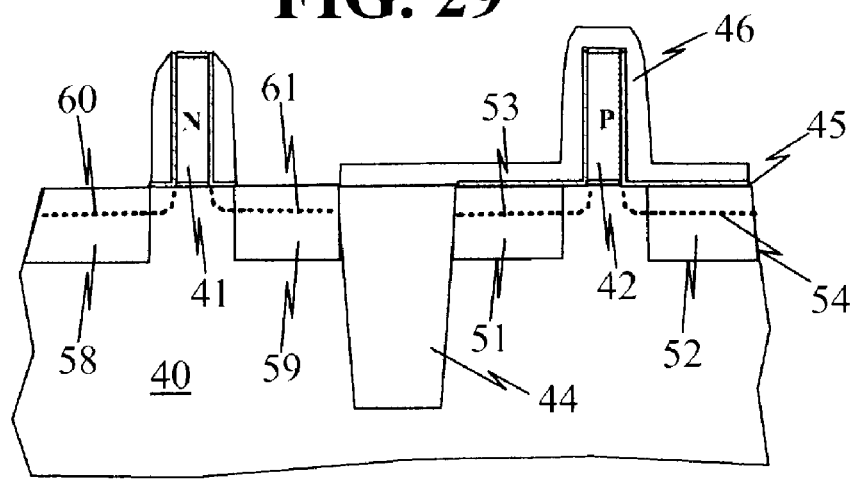
FIG. 29 is a cross-sectional view of the invention with the substrate of FIG. 27 showing the source and drain vertical profiles from the in-situ doping in FIG. 27.
Figure 30:
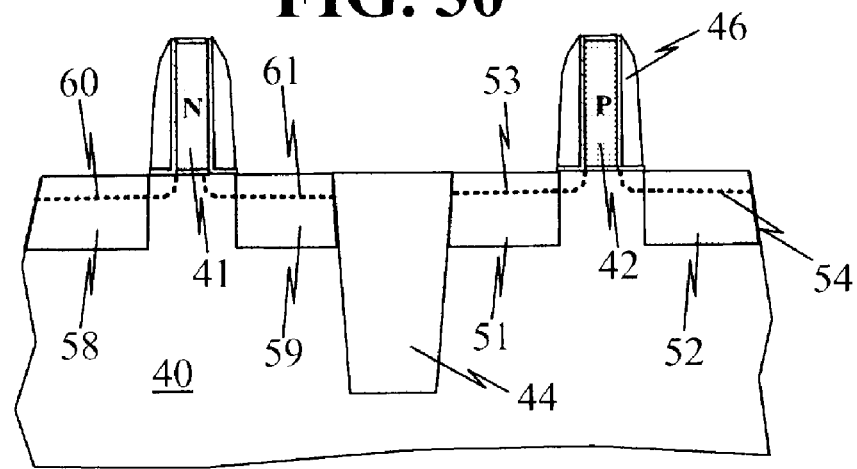
FIG. 30 is a cross-sectional view of the invention showing the combined substrates of FIGS. 23 and 29.

Again, in accordance with the present invention, instead of forming embedded strained regions, as practiced in the prior art method, a halo/extension of ions 56, of which the halo is preferably boron (B), indium (In) or a combination thereof and of which the extension is preferably arsenic (As), phosphorus (P), antimony (Sb), or a combination thereof, are implanted into the silicon recesses 54 and 55, as shown in FIG. 27. After the implant of the halo/extension ions, the recesses are filled by low to high temperature epitaxially grown embedded strained layers 57 and 58 as shown in FIG. 28, with in-situ doping for the source 59 and drain 60 by preferably arsenic (As), phosphorus (P), Antimony (Sb) or the combination thereof, whose vertical profiles are shown in FIG. 29. In the present instance, these embedded strained regions 57 and 58 are not SiGe as in the p-FET, but are SiC and activated by an anneal (not shown), thereby completing the n-FET and the CMOS, as shown in FIG. 30. The percentage of C in the embedded strained eSiC is from 2% to 15%.

Figure 31:
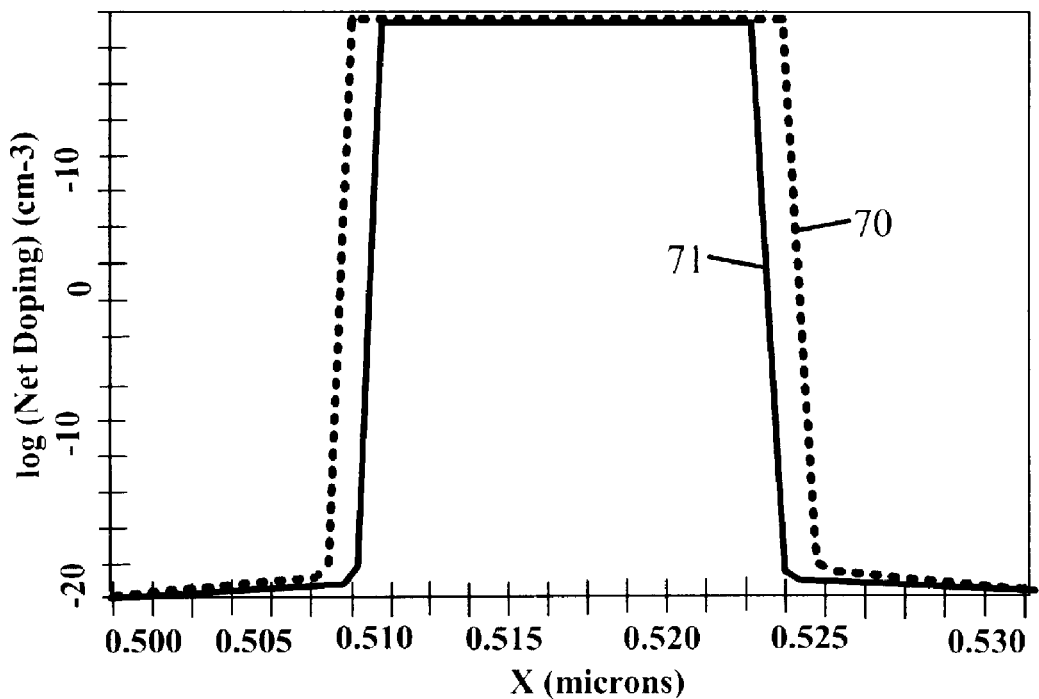
FIG. 31 is a graph comparing the net doping (lateral diffusion of boron) between the prior art method and the method of the present invention.

One advantage, which flow from the sequence of steps of the present invention in the fabrication of the FET transistor is better net-doping. That is, by implanting the halo/extension ions into the recesses as shown in FIGS. 21 and 27 before epitaxially growing the embedded strained layers in the silicon recesses, the lateral diffusions of, for example boron (B), indium (In), arsenic (As), phosphorus (P), or Antimony (Sb), are reasonably reduced as shown by the graph of FIG. 31. In the graph in FIG. 31, in which "log(Net Doping)(cm-3)" is plotted against "X(microns), the halo/extension ions implant before the embedded strained layer formation sequence of the present invention shows, by the dashed line 70, a substantial improvement in lateral diffusion, of herein boron, over the prior art sequence method of FIGS. 1 and 15, as illustrated by solid line 71. For the data of this graph for p-FET or PMOS, arsenic, phosphorus or antimony is used as the halo ions and strained eSeGe is used as the embedded layers. Similar results are obtained with n-FET or NMOS with the appropriate dopants for the halo/extension and source/drain and using strained eSiC for the embedded strained layer.

Figure 32:
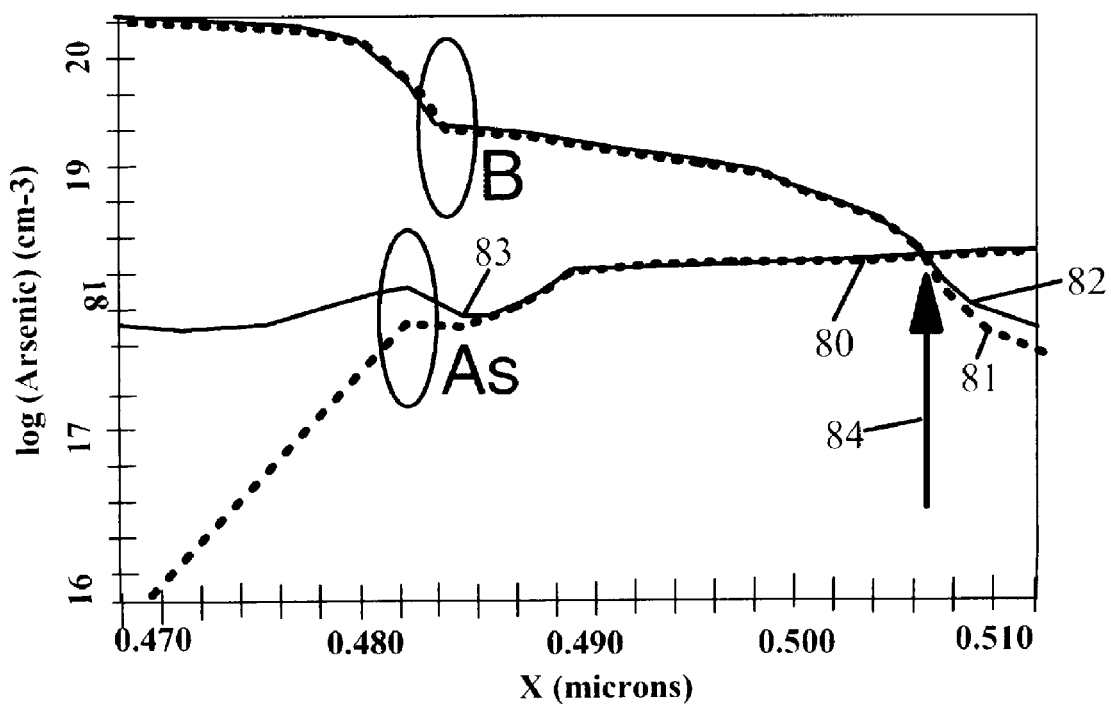
FIG. 32 is a graph showing the similarity of the lateral profiles of boron and arsenic from the prior art method and from the method of the present invention.

Another advantage or unexpected result is that junction depths of the method of the present invention are not changed from the prior art method. Shown in FIG. 32 is a comparison of the lateral profiles of boron and arsenic between the method of the present invention and the prior art method where the sample for the data was cut through the channel of the transistor from source to drain. The plot is "log(Arsenic) (cm-3)" versus "(microns)". The dashed line 80 is the lateral profile of arsenic (As) from the method of the present invention and the dashed line 81 is the lateral profile of boron (B) from method of the present invention. The solid line 82 is the lateral profile of the arsenic (As) from the prior art method and solid line 83 is the lateral profile of boron (B) from the prior art method. The arrow 84 shows the point where the profiles of the present invention and the prior art method intersect at the PN junction.

Figure 33:
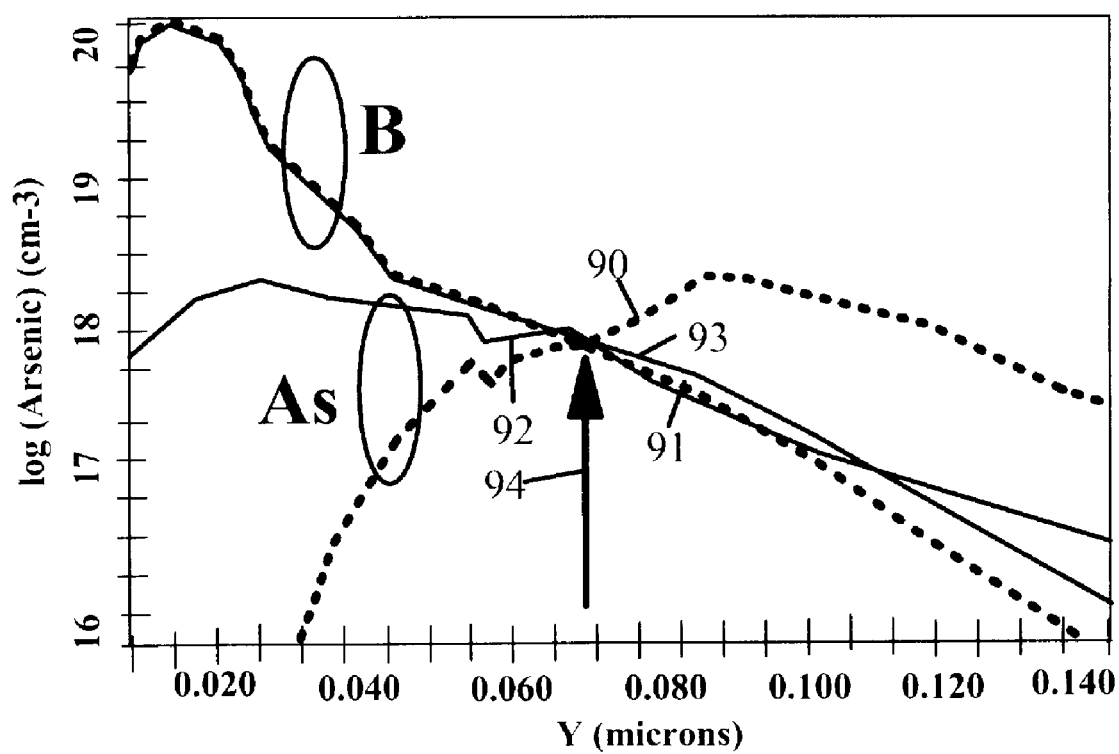
FIG. 33 is a graph showing the similarity of the vertical profiles of boron and arsenic from the prior art method and from the method of the present invention.

The vertical profile, as shown in FIG. 33, supports the unexpected result that the junction depth is not essentially changed between the method of the present invention and the prior art method as shown in FIGS. 1-15. FIG. 33 shows a plot of "log(Arsenic)(cm-3)" versus "Y(microns)". The dashed line 90 is the vertical profile of arsenic (As) from the method of the present invention and the dashed line 91 is the vertical profile of boron (B) from the present invention. The solid line 92 is the vertical profile of the arsenic (As) from the prior art method and solid line 93 is the vertical profile of boron (B)

from the prior art method. The arrow 94 shows the point where the profiles of the present invention and the prior art method intersect at the PN junction.

Another advantage of the present invention is that boron diffusions in both the lateral and vertical directions are reduced because of the existing arsenic halo/extension implanted ions are already in place, Although the invention has been shown and described with respect to certain embodiments, equivalent alterations and modifications will occur to those skilled in the art upon reading and understanding this specification and drawings. In doing so, those skilled in the art should realize that such alterations and modifications are within the spirit and scope of the present invention as set forth in the appended claims and equivalents thereon. Those skilled in the art also will understand that the semiconductor structure described by the present inventive technique will be part of a larger semiconductor device incorporating a large plurality of semiconductor devices. For example, the semiconductor structure could be part of a p-channel or n-channel MOSFET integrated circuit, or part of a CMOS which incorporates both p-channel and n-channel MOSFET integrated circuits which embody the present inventive techniques.

What is claimed is:

1. In a method of fabricating a semiconductor transistor for an integrated circuit chip comprising the sequential steps of:
   providing a substrate without a halo/extension region therein;
   forming at least one gate structure on the surface of said substrate;
   forming a pair of recesses in the substrate on either side of said gate structure;
   forming halo/extension regions by implanting ions in said recesses;
   filling the recesses with embedded semiconductor strained layers for said transistor and,
   forming the source and drain of the transistor by in-situ doping after filling the recesses, whereby the sequence of halo/extension implanting in the recesses before filling the recesses reduces the relaxation of the stress/strain in the embedded semiconductor strained layers and do not affect the junction depth of the source and drain.

2. The method of claim 1 wherein two gates structures are formed on said substrate, one being n-type and the other being p-type.

3. The method of claim 2 wherein recesses are formed on both sides of both of said gates and halo/extension ions are implanted into the recesses.

4. The method of claim 3 wherein the embedded semiconductor strained layer formed in the recesses on both sides of the n-type gate is different from the embedded strained layer formed in the recesses on both side of the p-type gate.

5. The method of claim 1 wherein said recesses are filled by selective epitaxial growth of said embedded semiconductor strained layer.

6. The method of claim 5 wherein said epitaxial growth of the semiconductor embedded strained layer provides in-situ doping for the source and drain of the transistor.

7. The method of claim 5 wherein the embedded semiconductor strained layer for the n-type gate is eSiC.

8. The method of claim 6 wherein the embedded semiconductor strained layer for the p-type gate is eSiGe.

9. The method of claim 1 wherein said recesses are filled by selective epitaxially growing the embedded semiconductor strained layers in the recesses.

10. The method of claim 1 wherein the embedded semiconductor strained layers for the n-type gate is eSiC and the embedded strained layers for the p-type gate is eSiGe.

11. The method of claim 10 wherein the percentage of Ge in the embedded strained layers is 10% to 40%.

12. The method of claim 10 wherein the percentage of C in the embedded strained layers is 2% to 15%.

13. The method of claim 1 wherein B, In, As, P or Sb are used as dopants and lateral diffusion of these dopants is reasonably reduced.

14. The method of claim 13 wherein the dopant is B and its diffusion is also reduced in the vertical direction.

* * * * *